(12) United States Patent
Chaahoub et al.

(10) Patent No.: US 9,106,212 B2
(45) Date of Patent: Aug. 11, 2015

(54) METHOD AND APPARATUS FOR INTERFACING INTEGRATED CIRCUITS (ICS) THAT OPERATE AT DIFFERENT SUPPLY VOLTAGES

(71) Applicant: Avago Technologies General IP (Singapore) Pte. Ltd., Singapore (SG)

(72) Inventors: Faouzi Chaahoub, San Jose, CA (US); Georgios Asmanis, Lake Forest, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 132 days.

(21) Appl. No.: 14/068,359

(22) Filed: Oct. 31, 2013

(65) Prior Publication Data

US 2015/0116005 A1 Apr. 30, 2015

(51) Int. Cl.
*H03K 3/00* (2006.01)
*H03K 3/012* (2006.01)

(52) U.S. Cl.
CPC ..................................... *H03K 3/012* (2013.01)

(58) Field of Classification Search
None
See application file for complete search history.

(56) References Cited

U.S. PATENT DOCUMENTS

| 5,959,490 | A | 9/1999 | Candage et al. | |
|---|---|---|---|---|
| 6,252,450 | B1* | 6/2001 | Patti et al. | 327/424 |
| 6,762,625 | B1* | 7/2004 | Devnath | 326/115 |
| 7,042,254 | B2* | 5/2006 | Hori | 327/65 |
| 7,567,628 | B2* | 7/2009 | Darabi | 375/318 |
| 7,812,643 | B2* | 10/2010 | Govindu et al. | 326/115 |
| 2009/0085645 | A1* | 4/2009 | Tanaka | 327/407 |
| 2012/0032944 | A1* | 2/2012 | Kojima | 345/212 |
| 2012/0057261 | A1 | 3/2012 | Poulton et al. | |
| 2012/0249188 | A1* | 10/2012 | Nishi et al. | 327/108 |
| 2013/0278296 | A1* | 10/2013 | Amirkhany et al. | 327/108 |
| 2015/0116005 | A1* | 4/2015 | Chaahoub et al. | 327/108 |

OTHER PUBLICATIONS

Analog Devices Xstream 4.25 Gbps, 16 x 16, Digital Crosspoint Switch Data Sheet ADN4604, Analog Devices, Inc., 2009-2013, 40 pages, Norwood, MA, USA.

\* cited by examiner

*Primary Examiner* — Lincoln Donovan
*Assistant Examiner* — Khareem E Almo

(57) ABSTRACT

A Tx IC and an Rx IC that use different supply voltages are mounted on a circuit board and interfaced via traces of the board. The configuration of the Tx IC is such that DC decoupling is provided between the ICs while also preventing inadvertent turn-on of the ESD diodes of the Rx IC. These features make it possible to provide DC decoupling between high-performance Tx ICs that use relatively high supply voltages and Rx ICs that use relatively low supply voltages without the need for AC coupling capacitors and while also preventing ESD protection of the Rx IC from being degraded.

21 Claims, 3 Drawing Sheets

US 9,106,212 B2

METHOD AND APPARATUS FOR INTERFACING INTEGRATED CIRCUITS (ICS) THAT OPERATE AT DIFFERENT SUPPLY VOLTAGES

TECHNICAL FIELD OF THE INVENTION

The invention relates to interfacing integrated circuits (ICs) that operate at different supply voltages.

BACKGROUND OF THE INVENTION

In circuit boards, such as printed circuit boards (PCBs), electrically-conductive traces are used to interface electrical contacts of ICs to electrical contacts of other ICs to allow the ICs to transmit electrical signals among them. In such environments, there is at least one transmitting (Tx) IC and at least one receiving (Rx) IC. The Tx IC includes at least one Tx driver circuit that drives the respective trace to transmit an electrical signal over the trace. The Rx IC includes at least one receiver circuit that receives the electrical signal transmitted over the trace. Typically, the transmitter driver circuit includes a differential transistor pair that generates a differential signal that is transmitted over two side-by-side traces of the PCB. The Rx circuit includes decoding circuitry that decodes the transmitted differential signal into a logic 1 or logic 0.

It is not uncommon for the Tx and Rx ICs to operate at different supply voltages. For example, high performance, high signal integrity ICs typically operate at 2.5 volts (V) and are designed with current mode logic (CML) created via silicon germanium (SiGe) processes to achieve better input sensitivities at the receiver side, higher output swing of the differential signal on the transmitter side, and lower jitter on retimer circuits. On the other hand, the Rx ICs are often application specific integrated circuits (ASICs) or digital signal processor (DSP) ICs that are designed in complementary metal oxide semiconductor (CMOS) processes to have reduced geometries that provide benefits in terms of power and area savings. Often times, deep submicron CMOS processes are used to make these ICs, and the resulting ICs operate at supply voltage levels of 1.0 V or less.

Alternating current (AC) coupling capacitors are typically disposed in between the transmitter and receiver ICs and connected to the traces. The AC coupling capacitors decouple the direct current (DC) components of the two ICs.

FIG. 1 illustrates a block diagram of a Tx IC 2 and an Rx IC 3 mounted on a PCB 20 and interfaced via two PCB traces 4 and 5 having respective AC coupling capacitors 6 and 7 connected in line in the respective traces 4 and 5. The Tx IC 2 includes a Tx driver circuit 8 that includes a Tx analog front end analog (AFE) portion 9, a differential transistor pair 11, a current source 12, two resistors 13 and 14, a 2.5 V voltage supply 15, and two output terminals 16 and 17. The AFE portion 9 includes analog circuitry (not shown) that drives the bases of two bipolar junction transistors (BJTs) 21 and 22 of the differential transistor pair 11. The emitters of the BJTs 21 and 22 are connected to one another and to the current source 12, which is connected to ground. The collectors of the BJTs 21 and 22 are connected to the output terminals 16 and 17, respectively, and to first terminals of the resistors 13 and 14, respectively. Second terminals of the resistors 13 and 14 are connected to the 2.5 V voltage supply 15. The output terminals 16 and 17 of the Tx driver circuit 8 are connected on first ends to contacts 31 and 32 of the PCB 20 on which the Tx and Rx ICs 2 and 3 are mounted and are connected on second ends to the first terminals of the resistors 13 and 14, respectively.

The contacts 31 and 32 of the PCB 20 are connected to first ends of the traces 4 and 5, respectively.

The Rx IC 3 includes a receiver circuit 33, which includes an Rx AFE portion 34, first and second resistors 35 and 36, first and second ESD diodes 37 and 38, a first voltage supply 41, a second voltage supply 42, a first input terminal 43 and a second input terminal 44. The voltage supplies 41 and 42 typically provide supply voltages that are equal to or slightly less than 1.0 V. The input terminals 43 and 44 are connected on first ends to the Rx AFE portion 34 and on second ends to contacts 46 and 47, respectively, of the PCB 20. The contacts 46 and 47 of the PCB 20 are connected to second ends of the traces 4 and 5, respectively. The anodes of the ESD diodes 37 and 38 are connected to the input terminals 43 and 44, respectively. The cathodes of the ESD diodes 37 and 38 are connected to the voltage supply 41. First terminals of the resistors 35 and 36 are connected to the input terminals 43 and 44, respectively, and second terminals of the resistors 35 and 36 are connected to the voltage supply 42.

The AC coupling capacitors 6 and 7 are connected in line along the traces 4 and 5, respectively, such that capacitor 6 is interposed in between PCB contacts 31 and 46 and such that capacitor 7 is interposed in between PCB contacts 32 and 47. The resistors 13, 14, 35, and 36 are typically 50 ohms each. During operation, the Tx AFE portion 9 drives the differential transistor pair 11 to cause the differential pair 11 to produce a differential voltage signal across the output terminals 16 and 17 of the Tx driver circuit 8. The AC coupling capacitors 6 and 7 decouple the DC components of the Tx and Rx ICs 2 and 3, respectively, and couple the differential voltage signal to the Rx IC 3. The Rx IC 3 receives the differential signal and the AFE portion 34 decodes the differential signal.

Although the placement of the AC coupling capacitors 6 and 7 in line along the traces 4 and 5 provides adequate DC decoupling of the ICs 2 and 3 in cases where the ICs 2 and 3 use the same or different voltage supplies, the inclusion of the AC coupling capacitors 6 and 7 on the PCB 20 increases system costs and complicates the build of high-performance PCB traces, especially when considering that there are typically many such Tx and Rx circuits on a PCB.

The AC coupling capacitors are sometimes incorporated into the Rx IC 3. FIG. 2 illustrates a block diagram of the Tx IC 2 interfaced with the Rx IC 3 via the PCB traces 4 and 5 where the AC coupling capacitors 6 and 7 have been moved to the interior of the Rx IC 3 and connected in line between the input terminals 43 and 44 of the Rx IC 3 and respective inputs of the Rx AFE portion 34. The incorporation of the capacitors 6 and 7 into the receiver IC does not provide DC decoupling in cases where the Tx IC 2 and the Rx IC 3 operate at different voltage supplies, as in FIGS. 1 and 2. In addition, the ESD diodes 37 and 38 may inadvertently turn on if the supply differential voltage between the Tx IC 2 and the Rx IC 3 exceeds the diode chain turn-on threshold voltage. This latter problem can be avoided by stacking ESD diodes to increase the turn-on threshold voltage of the diode chain, but stacking ESD diodes in this manner also degrades the ESD performance of the Rx IC.

Accordingly, a need exists for a way to interface ICs that operate at different supply voltages while providing DC decoupling of the ICs and while preventing inadvertent turn-on of the ESD diodes.

SUMMARY OF THE INVENTION

The invention provides a Tx IC and a system for interfacing a Tx IC that operates at one supply voltage with an Rx IC that operates at another supply voltage while providing DC decoupling without the need for using AC coupling capacitors and while preventing ESD performance of the Rx IC from being degraded. The Tx IC comprises an AFE portion and a Tx driver circuit. The AFE portion has first and second output terminals over which a pair of output signals are outputted from the AFE portion. The Tx driver circuit comprises a differential transistor pair, a resistive divider network, a voltage supply, a current source, and first and second output terminals. The differential transistor pair comprises first and second transistors, each having at least first, second and third terminals. The first terminals of the first and second transistors are electrically coupled to the first and second output terminals, respectively, of the Tx AFE portion for receiving the pair of output signals outputted from the AFE portion. The second terminals of the first and second transistors are connected to one another and are electrically coupled to a first terminal of the current source. The second terminal of the current source is electrically coupled to ground. The third terminals of the first and second transistors are electrically coupled to first and second input terminals, respectively, of the resistive divider network.

The resistive divider network has first and second output terminals that are electrically coupled to the first and second output terminals, respectively, of the Tx driver circuit. The first and second output terminals of the Tx driver circuit are connectable to first ends of the first and second electrically-conductive traces to enable the Tx driver circuit to drive the first and second electrically-conductive traces. The resistive divider network is electrically coupled at a first node of the resistive divider network to the voltage supply and at a second node of the resistive divider network to ground. The Tx driver circuit provides a Tx output common mode voltage, $V_{TXCM}$, at the output terminals of the Tx driver circuit, and provides a Tx internal common mode voltage, $V_{TXCM\_INT}$, at the input terminals of the resistive divider network. The resistive divider network is configured to shift a level of the Tx output common mode voltage, $V_{TXCM}$, from a first level to a second level that is compatible with a voltage supply of an Rx IC connected to opposite ends of the traces.

The system comprises a circuit board (CB) having at least a first pair of electrically-conductive traces disposed thereon, a Tx IC mounted on the CB and electrically coupled to first ends of the traces, and an Rx IC mounted on the CB and electrically coupled to second ends of the traces. The Tx IC comprises at least a Tx AFE portion and a Tx driver circuit. The Tx driver circuit is electrically coupled to first and second output terminals of the Tx AFE portion and has first and second output terminals that are electrically coupled to first ends of the traces. The Tx driver circuit includes a resistive divider network that is electrically coupled at a first node of the network to a Tx voltage supply and that is electrically coupled at a second node of the network to ground. The Tx voltage supply supplies a first supply voltage to the network. The network is configured to shift a level of a Tx output common mode voltage, $V_{TXCM}$, that is outputted at the first and second output terminals of the Tx driver circuit from a first level to a second level.

The Rx IC comprises an Rx voltage supply, first and second load resistors, first and second diodes, an Rx AFE portion, and first and second Rx input terminals. The Rx voltage supply supplies the diodes with a second supply voltage that is different from the first supply voltage. The first ends of the first and second input terminals of the Rx IC are electrically coupled to the Rx AFE and second ends of the first and second input terminals of the Rx IC are electrically coupled to second ends of the traces. The first terminals of the first and second diodes are electrically coupled to the Rx voltage supply and second terminals of the first and second diodes are electrically coupled to the first and second Rx input terminals. The second level to which $V_{TXCM}$ is shifted is compatible with the second supply voltage supplied by the Rx voltage supply.

These and other features and advantages of the invention will become apparent from the following description, drawings and claims.

DETAILED DESCRIPTION OF AN ILLUSTRATIVE EMBODIMENT

In accordance with embodiments described herein, a Tx IC and an Rx IC that use different supply voltages are interfaced, and the configuration of the Tx IC is such that DC decoupling is provided between the ICs while also preventing inadvertent turn-on of the ESD diodes of the Rx IC. These features make it possible to provide DC decoupling between high-performance Tx ICs that use relatively high supply voltages and Rx ICs that use relatively low supply voltages without degrading ESD protection of the Rx IC. The benefits of these features include lower system costs and reduced build complexity.

Figure 1:
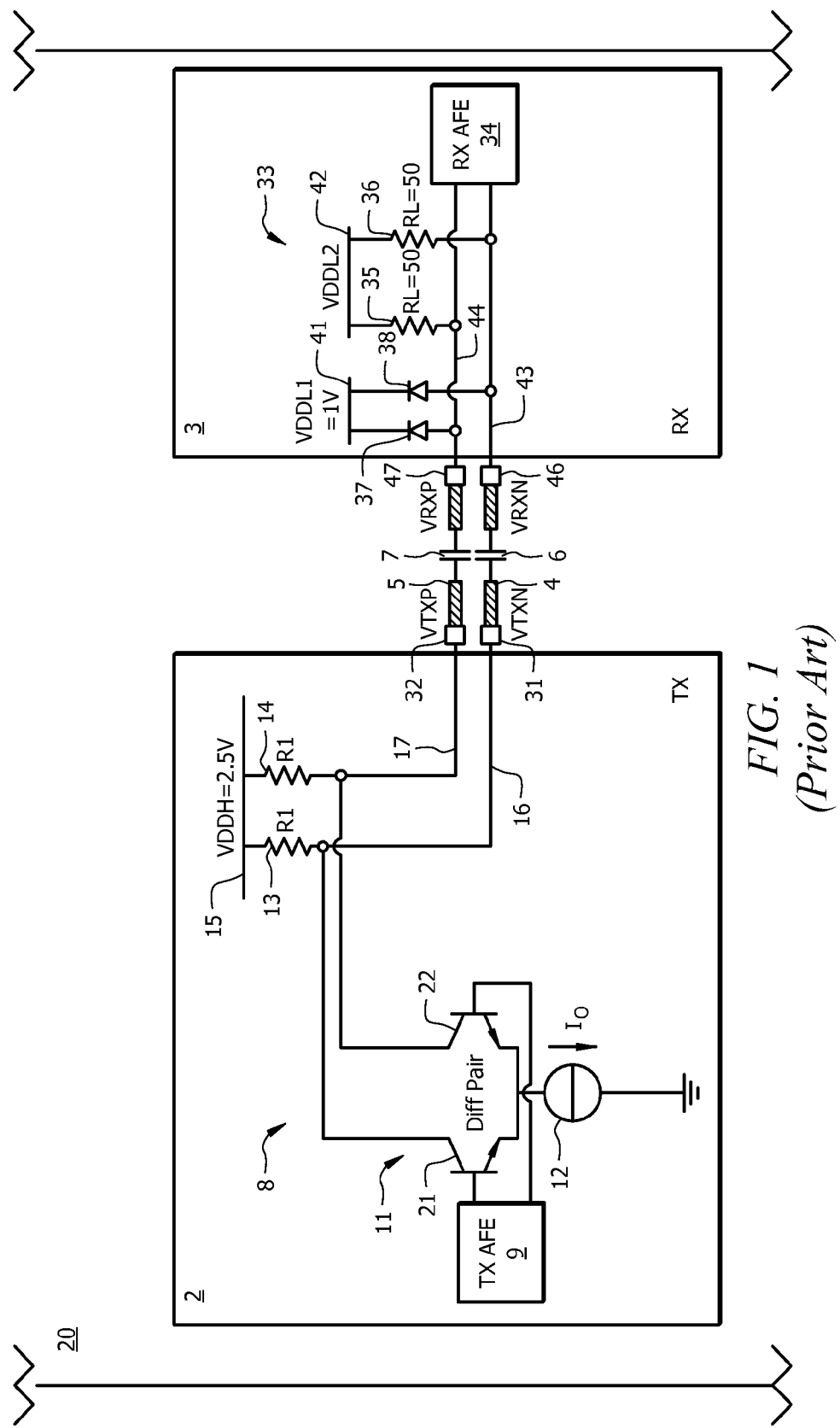
FIG. 1 illustrates a block diagram of a known configuration of a Tx IC and an Rx IC mounted on a PCB and interfaced via two PCB traces having respective AC coupling capacitors connected in line in the respective traces in between the ICs.
Figure 2:
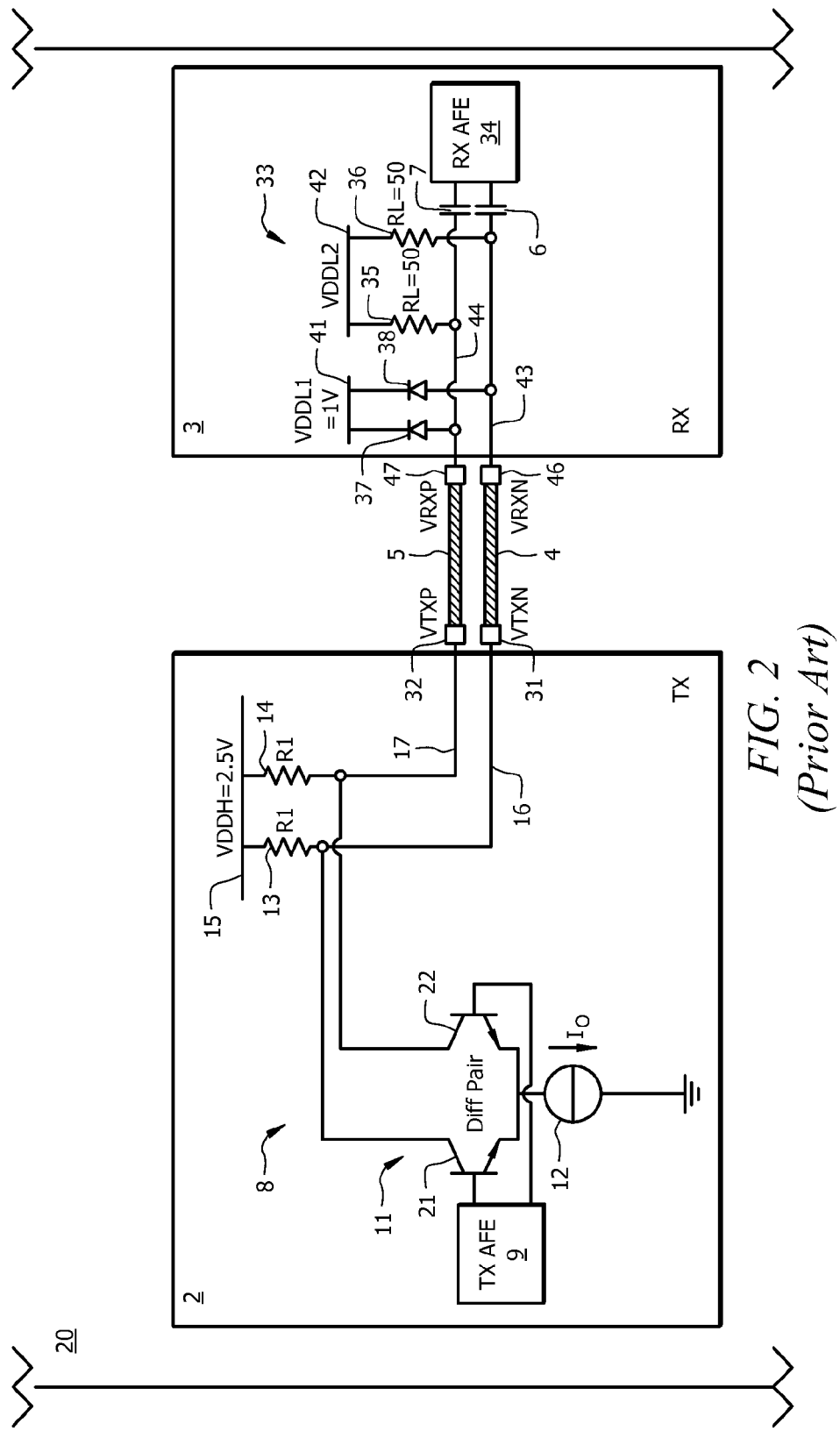
FIG. 2 illustrates a block diagram of a known configuration of the Tx IC and the Rx IC 3 mounted on the PCB as shown in FIG. 1 and interfaced via the PCB traces, but where the AC coupling capacitors shown in FIG. 1 have been moved to the interior of the Rx IC.

In accordance with an illustrative, or exemplary, embodiment, the Tx IC is provided with a resistive divider network that level shifts the output common mode voltage of the Tx IC to a level that is compatible with the supply voltage level of the RX IC. By shifting the level of the output common mode voltage of the Tx IC in this manner, DC decoupling between the ICs is provided while also preventing inadvertent turn-on of the ESD diodes. The shift in the level of the output common mode voltage of the Tx IC is designed to ensure that the interior common mode voltage of the Tx IC does not detrimentally affect the high performance of the differential transistor pair of the Tx IC that drives the high-performance traces of the PCB. In addition, the need for AC coupling capacitors on the PCB or in the Rx IC is eliminated. Illustrative embodiments will now be described with reference to FIG. 3. Like reference numerals in FIGS. 1-3 represent like features, elements or components.

Figure 3:
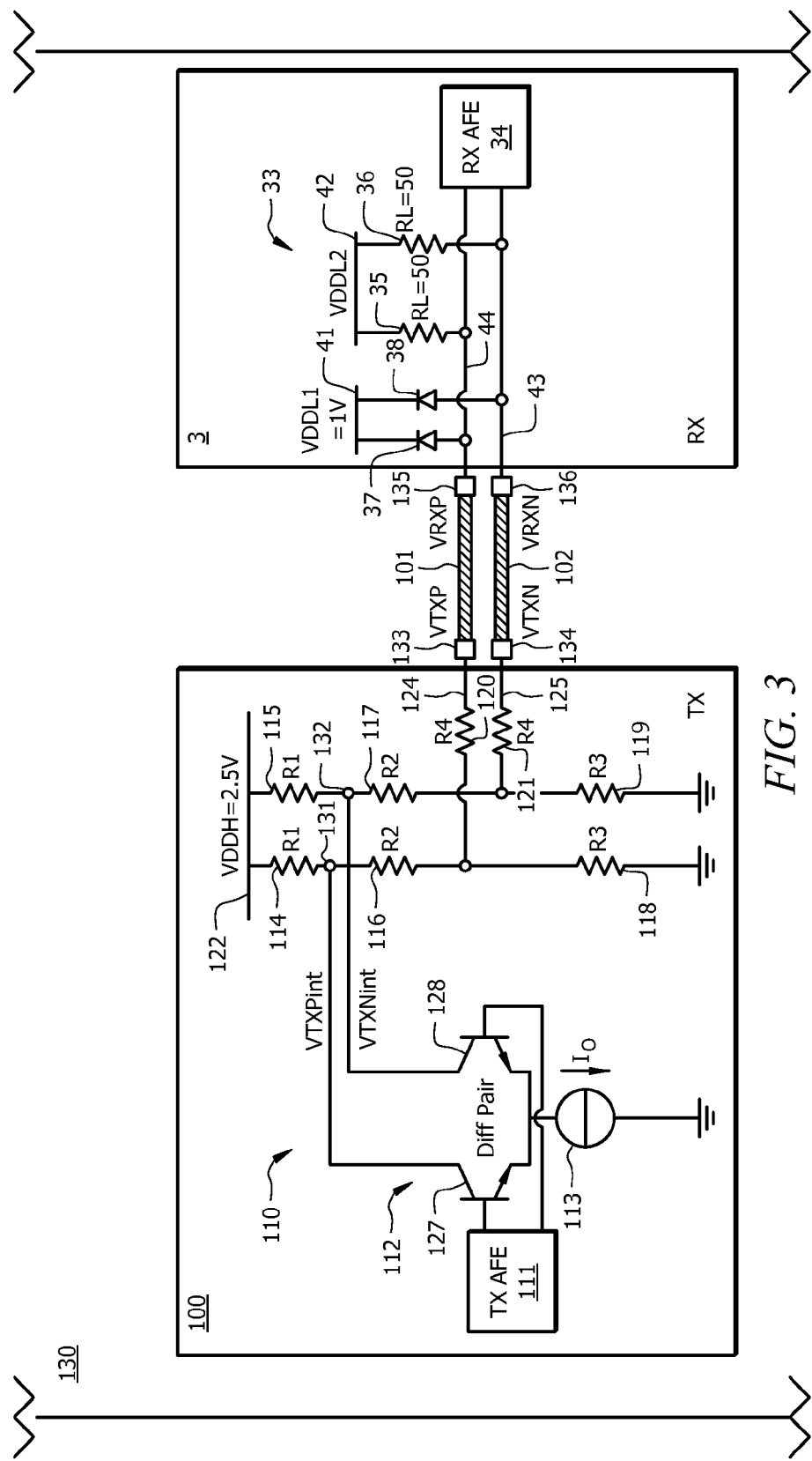
FIG. 3 illustrates a block diagram of a Tx IC in accordance with an illustrative embodiment interfaced with an Rx IC via two PCB traces of a PCB on which the Tx IC and the Rx IC are mounted.

FIG. 3 illustrates a block diagram of a Tx IC 100 interfaced with an Rx IC 3 via two PCB traces 101 and 102 of a PCB 130 on which the Tx IC 100 and the Rx IC 3 are mounted. The Rx IC 3 may be identical to the Rx IC 3 shown in FIG. 1. The Tx IC 100 includes a Tx driver circuit 110 that includes a Tx AFE portion 111, a differential transistor pair 112, a current source 113, eight resistors 114-121, a 2.5 V voltage supply 122, and two output terminals 124 and 125. The AFE portion 111 includes analog circuitry (not shown) that produces a pair of signals that drives the bases of two BJTs 127 and 128 of the differential transistor pair 112. The emitters of the BJTs 127 and 128 are connected to one another and to the current source 113, which is connected to ground. The collectors of the BJTs 127 and 128 are connected to first and second input terminals 131 and 132, respectively, of the resistive divider network made up of resistors 114-121. It should be noted that although the differential pair in accordance with this illustrative embodiment is made up of BJTs, a variety of other types of transistors may be used for this purpose, such as, for example, various types of field effect transistors (FETs), as will be understood by those of skill in the art in view of the description being provided herein.

First terminals of the resistors 114 and 115 are connected to the first and second input terminals 131 and 132, respectively, of the resistive divider network and to second terminals of the resistors 116 and 117, respectively. Second terminals of the resistors 114 and 115 are connected to the 2.5 V voltage supply 122. First terminals of the resistors 116 and 117 are connected to second terminals of the resistors 118 and 119, respectively, and to second terminals of the resistors 120 and 121, respectively. First terminals of resistors 118 and 119 are connected to ground. First terminals of resistors 120 and 121 are connected to the output terminals 124 and 125, respectively, of the Tx IC 100. The output terminals 124 and 125 of the Tx IC 100 are connected to contacts 133 and 134, respectively, of the PCB 130 on which the Tx and Rx ICs 100 and 3 are mounted. The contacts 133 and 134 of the PCB 130 are connected to first ends of the traces 101 and 102, respectively. Second ends of the traces 101 and 102 are connected to contacts 135 and 136, respectively, of the PCB 130. The contacts 135 and 136 are connected to the input terminals 44 and 43, respectively, of the Rx IC 3.

In accordance with an illustrative embodiment, the resistances of the resistors 114-121 are selected to cause the level of the output common mode voltage of the Tx IC 100 to shift to a level that is compatible with the 1.0 V voltage supply 41 of the Rx IC 3. Typically, the voltage supplies 41 and 42 supply equal voltages, in which case the output common mode voltage of the Tx IC 100 is shifted to a level that is compatible with either of the voltage supplies 41 and 42. If the voltage supply 41 is significantly greater than the voltage supply 42, then the resistances of the resistors 114-121 will typically be selected to cause the level of the output common mode voltage of the Tx IC 100 to shift to a level that is compatible with voltage supply 42. If the voltage supply 42 is significantly greater than the voltage supply 41, then the resistances of the resistors 114-121 will typically be selected to cause the level of the output common mode voltage of the Tx IC 100 to shift to a level that is compatible with voltage supply 41.

The output common mode voltage of the TX IC 100 is defined as: $V_{TXCM}=(V_{TXP}+V_{TXN})/2$, where $V_{TXCM}$ is the output common mode voltage of the Tx IC 100 and $V_{TXP}$ and $V_{TXN}$ are the voltage levels between contacts 133 and 134 and ground, respectively. Typical values for the resistors 114-121 for a 2.5 V-supply voltage Tx IC and a 1.0 V-supply voltage Rx IC having 50 ohm resistance values for resistors 35 and 36, such as shown in FIG. 3, are as follows: resistors 114 and 115 are 50 ohm resistors; resistors 116 and 117 are 75 ohm resistors; resistors 118 and 119 are 83 ohm resistors; and resistors 120 and 121 are 0 ohm resistors. Resistors 120 and 121 are included to allow incremental adjustments to be made to VTXCM, but they may or may not be included in the resistive divider network.

An interior common mode voltage of the Tx IC 100 is defined as: $V_{TXCM\_INT}=(V_{TXP\_INT}+V_{TXN\_INT})/2$, where $V_{TXCM\_INT}$ is the interior common mode voltage of the Tx IC 100 and $V_{TXP\_INT}$ and $V_{TXN\_INT}$ are the voltage levels between terminals 131 and 132 and ground, respectively. When the level of the output common mode voltage of the Tx IC 100, $V_{TXCM}$, is shifted lower to be compatible with the voltage supply 41 of the Rx IC 3 so that the ESD diodes 37 and 38 do not turn on, but the resistance values of the resistors 114-121 ensure that the interior common mode voltage $V_{TXCM\_INT}$, is not shifted so low that it detrimentally affects the high performance of the differential transistor pair 112. In other words, $V_{TXCM\_INT}$ is kept at a sufficiently high level that it does not squeeze the headroom of the differential signal produced by the differential transistor pair 112 by an unacceptable or undesirable amount so that the Tx driver circuit 110 maintains the 50 ohm drive impedance needed to drive the high-speed traces 101 and 102 of the PCB 130.

It should be noted that the resistors 114-121 may have a variety of forms. For example, the resistors 114-121 may be transistors acting as resistors, in which case the resistance of the transistor is determined generally by its size. Alternatively, the resistors 114-121 may actually be fabricated as resistors using various dielectric layers of the IC 100. As will be understood by persons of skill in the art, virtually all elements, even conductors, have some resistance. Thus, the invention is not limited with respect to the manner in which the resistors 114-121 are formed or with respect to the components, elements or features of the IC 100 that are used to provide the desired resistances at the desired locations.

It should be noted that the invention has been described with respect to illustrative embodiments for the purpose of describing the principles and concepts of the invention. The invention is not limited to these embodiments. For example, while the invention has been described with reference to the use of a particular resistive divider network in the Tx IC 100, the invention is not limited to this particular configuration, as will be understood by those of skill in the art in view of the description being provided herein. Given the goals of the invention described herein, persons of skill in the art will be able to provide other designs that achieve the same or similar goals. For example, if the ESD diodes 37 and 38 are not included in the Rx IC 3, and/or if the resistances of the resistors 35 and 36 are other than 50 ohms, the resistive divider network may need to be configured differently from the configuration shown in FIG. 3 and/or with different resistance values. Also, while the design shown in FIG. 3 obviates the need for AC coupling capacitors, the invention does not preclude the inclusion of AC coupling capacitors in cases where their inclusion is deemed desirable or necessary. As will be understood by those skilled in the art in view of the description being provided herein, these and many other modifications may be made to the illustrative embodiments described above to achieve the goals of the invention, and all such modifications are within the scope of the invention.

What is claimed is:

1. An integrated circuit (IC) acting as a transmitter (Tx) IC for driving at least a first pair of electrically-conductive traces of a circuit board (CB), the IC comprising:

an analog front end (AFE) portion having first and second output terminals, the AFE portion outputting a pair of output signals from the first and second output terminals; and a Tx driver circuit, the Tx driver circuit comprising a differential transistor pair, a resistive divider network, a voltage supply, a current source, and first and second output terminals, the differential transistor pair comprising first and second transistors, each transistor having at least first, second and third terminals, the first terminals of the first and second transistors being electrically coupled to the first and second output terminals, respectively, of the Tx AFE portion for receiving respective output signals of the pair of output signals outputted from the AFE portion, the second terminals of the first and second transistors being connected to one another and electrically coupled to a first terminal of the current source, the second terminal of the current source being electrically coupled to ground, the third terminals of the first and second transistors being electrically coupled to first and second input terminals, respectively, of the resistive divider network, the resistive divider network having first and second output terminals that are electrically coupled to the first and second output terminals, respectively, of the Tx driver circuit, the first and second output terminals of the Tx driver circuit being connectable to first ends of the first and second electrically-conductive traces to enable the Tx driver circuit to drive the first and second electrically-conductive traces, the resistive divider network being electrically coupled at a first node of the resistive divider network to the voltage supply and at a second node of the resistive divider network to ground, wherein the Tx driver circuit provides a Tx output common mode voltage, $V_{TXCM}$, at the output terminals of the Tx driver circuit, and wherein the resistive divider network is configured to shift a level of $V_{TXCM}$ from a first level to a second level that is compatible with a voltage supply of an Rx IC.

2. The IC of claim 1, wherein the resistive divider network comprises first, second, third, fourth, fifth, and sixth resistors, the first and second resistors having first terminals that are electrically coupled to the first and second input terminals, respectively, of the resistive divider network, the first and second resistors having second terminals that are electrically coupled to the voltage supply, the third and fourth resistors having first terminals that are electrically coupled to the first and second output terminals, respectively, of the resistive divider network, the third and fourth resistors having second terminals that are electrically coupled to the first and second input terminals, respectively, of the resistive divider network, the fifth and sixth resistors having first terminals that are electrically coupled to ground, the fifth and sixth resistors having second terminals that are electrically coupled to the first and second output terminals, respectively, of the resistive divider network.

3. The IC of claim 2, wherein the resistive divider network further comprises seventh and eight resistors having first terminals that are electrically coupled to the first and second output terminals, respectively, of the Tx driver circuit, the seventh and eight resistors having second terminals that are electrically coupled to the first and second output terminals, respectively, of the resistive divider network.

4. The IC of claim 2, wherein the voltage supply of the IC provides supply voltage to the Tx driver circuit of about 2.5 volts (V).

5. The IC of claim 4, wherein the Tx driver circuit provides a drive impedance of about 50 ohms at the first and second output terminals of the Tx driver circuit.

6. The IC of claim 5, wherein the first and second resistors each have resistance values of about 50 ohms.

7. The IC of claim 6, wherein the third and fourth resistors each have resistance values of about 75 ohms.

8. The IC of claim 7, wherein the fifth and sixth resistors each have resistance values of about 83 ohms.

9. The IC of claim 8, wherein the first and second transistors are first and second bipolar junction transistors (BJTs), and wherein the first terminals of the BJTs correspond to the bases of the BJTs, and wherein the second terminals of the BJTs correspond to the emitters of the BJTs, and wherein the third terminals of the BJTs correspond to the collectors of the BJTs.

10. A system for interfacing a transmitter (Tx) integrated circuit (IC) operating at a first supply voltage with a receiver (Rx) IC operating at a second supply voltage that is different from the first supply voltage, the system comprising:
a circuit board (CB) having at least a first pair of electrically-conductive traces disposed thereon;
a Tx IC mounted on the CB, the Tx IC comprising at least a Tx analog front end (AFE) portion and a Tx driver circuit, the Tx driver circuit being electrically coupled to first and second output terminals of the Tx AFE portion, the Tx driver circuit having first and second output terminals that are electrically coupled to first ends of the traces, the Tx driver circuit including a resistive divider network that is electrically coupled at a first node of the network to a Tx voltage supply and that is electrically coupled at a second node of the network to ground, the Tx voltage supply supplying the first supply voltage to the network, the network being configured to shift a level of a Tx output common mode voltage, $V_{TXCM}$, that is outputted at the first and second output terminals of the Tx driver circuit from a first level to a second level; and
an Rx IC mounted on the CB, the Rx IC comprising an Rx voltage supply, first and second load resistors, first and second diodes, an Rx AFE portion, and first and second Rx input terminals, the Rx voltage supply supplying the diodes with the second supply voltage, wherein first ends of the first and second input terminals of the Rx IC are electrically coupled to the Rx AFE and wherein second ends of the first and second input terminals of the Rx IC are electrically coupled to second ends of the traces, and wherein first terminals of the first and second diodes are electrically coupled to the Rx voltage supply and wherein second terminals of the first and second diodes are electrically coupled to the first and second Rx input terminals, and wherein the second level to which $V_{TXCM}$ is shifted is compatible with the second supply voltage supplied by the Rx voltage supply.

11. The system of claim 10, wherein the Tx driver circuit further comprises:
a differential transistor pair and a current source, the Tx AFE portion outputting a pair of output signals from the first and second output terminals of the Tx AFE portion, the differential transistor pair receiving the pair of output signals outputted from the Tx AFE portion and generating a common mode differential signal that is applied to first and second input terminals of the resistive divider network, the resistive divider network having first and second output terminals that are electrically coupled to the first and second output terminals, respectively, of the Tx driver circuit.

12. The system of claim 11, wherein the shift of $V_{TXCM}$ to the second level ensures that the first and second diodes will not be inadvertently turned on by $V_{TXCM}$ being carried on the traces.

13. The system of claim 11, wherein the resistive divider network comprises first, second, third, fourth, fifth, and sixth resistors, the first and second resistors having first terminals that are electrically coupled to first and second input terminals, respectively, of the resistive divider network, the first and second resistors having second terminals that are electrically coupled to the Tx voltage supply, the third and fourth resistors having first terminals that are electrically coupled to the first and second output terminals, respectively, of the resistive divider network, the third and fourth resistors having second terminals that are electrically coupled to the first and second input terminals, respectively, of the resistive divider network, the fifth and sixth resistors having first terminals that are electrically coupled to ground, the fifth and sixth resistors having second terminals that are electrically coupled to the first and second output terminals, respectively, of the resistive divider network.

14. The system of claim 13, wherein the resistive divider network further comprises seventh and eight resistors having first terminals that are electrically coupled to the first and second output terminals, respectively, of the Tx driver circuit, the seventh and eight resistors having second terminals that are electrically coupled to the first and second output terminals, respectively, of the resistive divider network.

15. The system of claim 13, wherein the Tx voltage supply provides a supply voltage to the first node of the resistive divider network of about 2.5 volts (V).

16. The system of claim 15, wherein the Rx voltage supply provides a supply voltage to the diodes of about 1.0 V.

17. The system of claim 16, wherein the Tx driver circuit provides a drive impedance of about 50 ohms at the first and second output terminals of the Tx driver circuit.

18. The system of claim 16, wherein the first and second resistors each have resistance values of about 50 ohms.

19. The system of claim 18, wherein the third and fourth resistors each have resistance values of about 75 ohms.

20. The system of claim 19, wherein the fifth and sixth resistors each have resistance values of about 83 ohms.

21. The system of claim 11, wherein the first and second transistors are first and second bipolar junction transistors (BJTs), and wherein the first terminals of the BJTs correspond to the bases of the BJTs, and wherein the second terminals of the BJTs correspond to the emitters of the BJTs, and wherein the third terminals of the BJTs correspond to the collectors of the BJTs.

* * * * *